United States Patent
Limberg

(10) Patent No.: US 6,667,760 B1
(45) Date of Patent: Dec. 23, 2003

(54) RECEIVER FOR DIGITAL TELEVISION SIGNALS HAVING CARRIERS NEAR UPPER FREQUENCY BOUNDARIES OF TV BROADCASTING CHANNELS

(75) Inventor: Allen LeRoy Limberg, Vienna, VA (US)

(73) Assignee: Samsung Electronics Co., Ltd., Suwon (KR)

(*) Notice: Subject to any disclaimer, the term of this patent is extended or adjusted under 35 U.S.C. 154(b) by 0 days.

(21) Appl. No.: 09/241,372

(22) Filed: Feb. 2, 1999

Related U.S. Application Data

(60) Provisional application No. 60/075,424, filed on Feb. 20, 1998.

(51) Int. Cl.[7] .............................. H04N 5/44; H04N 5/21
(52) U.S. Cl. .................... 348/21; 348/725; 348/726; 348/608; 375/346
(58) Field of Search .................... 348/21, 725, 726, 348/723, 724, 607, 608, 469, 470; 375/301, 321, 324, 346; 332/170; 329/304, 357; 455/337

(56) References Cited

U.S. PATENT DOCUMENTS

| | | | |
|---|---|---|---|
| 5,086,340 A | * | 2/1992 | Citta et al. .................... 348/21 |
| 5,087,975 A | * | 2/1992 | Citta et al. .................... 348/21 |
| 5,121,203 A | * | 6/1992 | Citta ........................... 348/724 |
| 5,243,304 A | * | 9/1993 | Rixon ........................ 332/170 |
| 5,408,262 A | * | 4/1995 | Kim et al. .................... 348/21 |
| 5,452,015 A | * | 9/1995 | Hulyalkar .................... 348/608 |
| 5,479,449 A | * | 12/1995 | Patel et al. .................. 375/316 |
| 5,512,957 A | * | 4/1996 | Hulyalkar .................... 348/607 |
| 5,574,496 A | * | 11/1996 | Nielsen et al. ................ 348/21 |
| 5,602,583 A | * | 2/1997 | Citta ........................... 348/21 |
| 5,619,534 A | * | 4/1997 | Hulyalkar .................... 375/263 |
| 5,821,988 A | * | 10/1998 | Citta et al. .................... 348/21 |
| 5,872,815 A | * | 2/1999 | Strolle et al. ................ 375/321 |
| 5,966,188 A | * | 10/1999 | Patel et al. .................. 348/726 |
| 6,211,924 B1 | * | 4/2001 | Patel et al. .................. 348/726 |

* cited by examiner

*Primary Examiner*—Michael H. Lee
*Assistant Examiner*—Jean W. Désir
(74) *Attorney, Agent, or Firm*—Robert E. Bushnell, Esq.

(57) ABSTRACT

In a receiver for receiving digital television (DTV) signals with carriers near the upper frequency boundaries of TV broadcasting channels, co-channel interfering NTSC video carrier and its lower frequency sidebands are removed from intermediate-frequency signal by trap filtering, preferably in SAW filtering used in the intermediate-frequency amplifier. Co-channel interfering NTSC chroma burst and lower frequency chroma sidebands also are removed from intermediate-frequency signal by trap filtering. Artifacts of co-channel interfering NTSC audio signal in baseband DTV signal recovered by in-phase synchrodyne circuitry are cancelled using Hilbert-transformed artifacts of co-channel interfering NTSC audio signal recovered by quadrature-phase synchrodyne circuitry. Locating DTV carriers close to 270 kHz below the uppermost limits of the TV broadcasting channels facilitates artifacts arising from chroma signals, video carriers and low-frequency video modulation of co-channel interfering NTSC signals being further reduced using comb filtering.

25 Claims, 6 Drawing Sheets

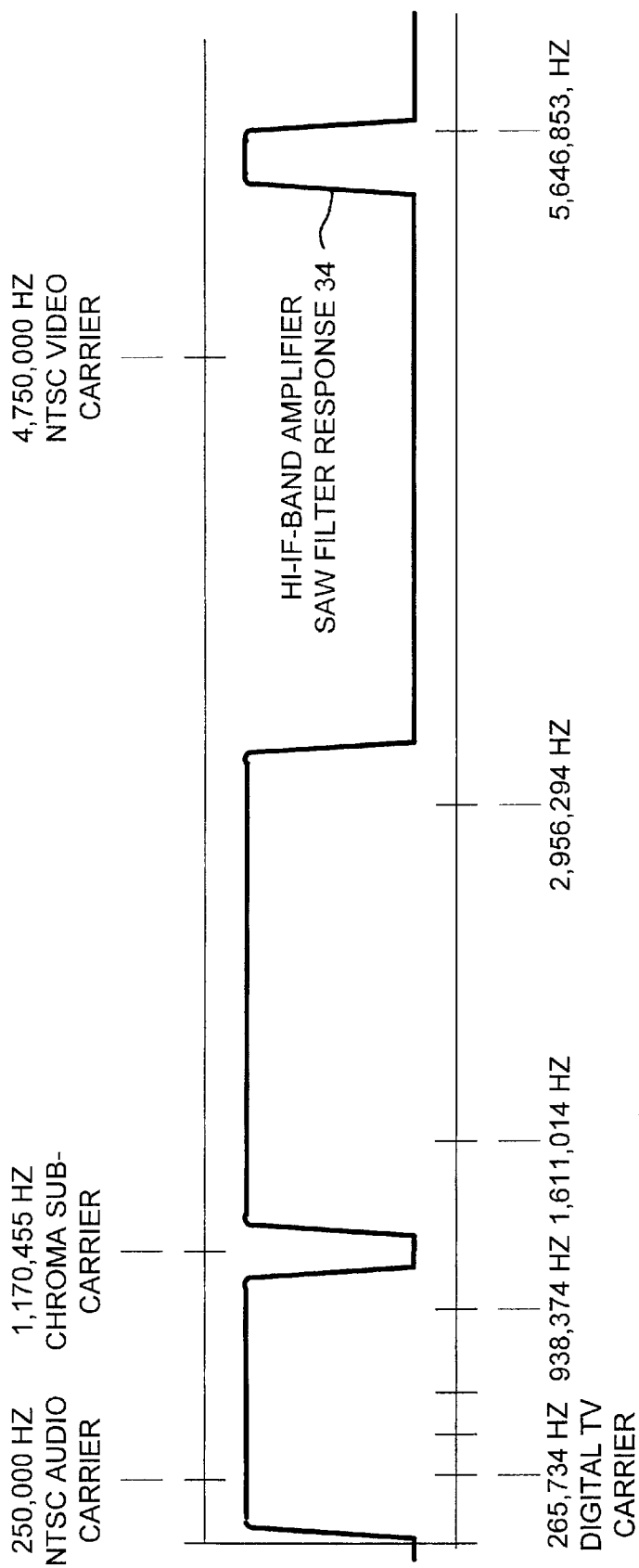

RECEIVER FOR DIGITAL TELEVISION SIGNALS HAVING CARRIERS NEAR UPPER FREQUENCY BOUNDARIES OF TV BROADCASTING CHANNELS

This application is filed under 35 U.S.C. 111(a) claiming pursuant to 35 U.S.C. 119(e)(1) benefit of the filing date of provisional application Ser. No. 60/075,424 filed Feb. 20, 1998, pursuant to 35 U.S.C. 111(b).

The invention relates to digital television (DTV) broadcasting using vestigial sideband (VSB) signals and, more particularly, to DTV signal receivers as used in DTV display apparatus or in DTV video tape recorders.

BACKGROUND OF THE INVENTION

A Digital Television Standard published Sep. 16, 1995 by the Advanced Television Systems Committee (ATSC) specifies vestigial sideband (VSB) signals for transmitting digital television (DTV) signals in 6-MHz-bandwidth television channels such as those currently used in over-the-air broadcasting of National Television System Committee (NTSC) analog television signals within the United States. The VSB DTV signal is designed so its spectrum is likely to interleave with the spectrum of a co-channel interfering NTSC analog TV signal. This is done by positioning the pilot carrier and the principal amplitude-modulation sideband frequencies of the DTV signal at odd multiples of one-quarter the horizontal scan line rate of the NTSC analog TV signal that fall between the even multiples of one-quarter the horizontal scan line rate of the NTSC analog TV signal, at which even multiples most of the energy of the luminance and chrominance components of a co-channel interfering NTSC analog TV signal will fall. The video carrier of an NTSC analog TV signal is offset 1.25 MHz from the lower limit frequency of the television channel. The carrier of the DTV signal is offset from such video carrier by 59.75 times the horizontal scan line rate of the NTSC analog TV signal, to place the carrier of the DTV signal about 309,877.6 Hz from the lower limit frequency of the television channel. Accordingly, the carrier of the DTV signal is about 2,690122.4 Hz from the middle frequency of the television channel. The exact symbol rate in the Digital Television Standard is (684/286) times the 4.5 MHz sound carrier offset from video carrier in an NTSC analog TV signal. The number of symbols per horizontal scan line in an NTSC analog TV signal is 684, and 286 is the factor by which horizontal scan line rate in an NTSC analog TV signal is multiplied to obtain the 4.5 MHz sound carrier offset from video carrier in an NTSC analog TV signal. The symbol rate is $10.762238*10^6$ symbols per second, which can be contained in a VSB signal extending 5.381119 MHz from DTV signal carrier. That is, the VSB signal can be limited to a band extending 5.690997 MHz from the lower limit frequency of the television channel.

VSB signals using 8-level symbol coding will be used in over-the-air broadcasting within the United States, and VSB signals using 16-level symbol coding can be used in over-the-air narrowcasting systems or in cable-casting systems. The ATSC standard for digital HDTV signal terrestrial broadcasting in the United States of America is capable of transmitting either of two high-definition television (HDTV) formats with 16:9 aspect ratio. One HDTV format uses 1920 samples per scan line and 1080 active horizontal scan lines per 30 Hz frame with 2:1 field interlace. The other HDTV format uses 1280 luminance samples per scan line and 720 progressively scanned scan lines of television image per 60 Hz frame. The ATSC standard also accommodates the transmission of DTV formats other than HDTV formats, such as the parallel transmission of four television signals having normal definition in comparison to an NTSC analog television signal.

DTV transmitted by vestigial-sideband (VSB) amplitude modulation (AM) for terrestrial broadcasting in the United States of America comprises a succession of consecutive-in-time data field each containing 313 consecutive-in-time data segments. There are 832 symbols per data segment. So, with the symbol rate being 10.76 MHz, each data segment is of 77.3 microseconds duration. Each segment of data begins with a line synchronization code group of four symbols having successive values of +S,–S,–S and +S. The value +S, is one level below the maximum posit ve data excursion, and the value –S is one level above the maximum negative data excursion. The initial line of each data field includes a field synchronization code group that codes a training signa for channel-equalization and multipath suppression procedures. The training signal is a 511 sample pseudo-random noise sequence (or "PN-sequence") followed by three 63-sample PN sequences. The middle one of these 63-sample PN sequences is transmitted in accordance with a first logic convention in the first line of each odd-numbered data field and in accordance with a second logic convention in the first line of each even-numbered data field, the first and second logic conventions being one's complementary with respect to each other. The other two 63-sample PN sequences and the 511-sample PN sequence are transmitted in accordance with the same logic convention in all data fields.

The remaining lines of each data field contain data that have been Reed-Solomon forward error-correction coded after having been randomized and subjected to diagonal byte interleaving. In over-the-air broadcasting the error-correction coded data are then trellis coded using twelve interleaved trellis codes, each a ⅔ rate punctured trellis code with one uncoded bit. Trellis coding results are parsed into three-bit groups for over-the-air transmission in eight-level one-dimensional-constellation symbol coding, which transmission is made without symbol pre-coding separate from the trellis coding procedure. Trellis coding is not used in cablecasting proposed in the ATSC standard. The error-correction-coded (ECC) data are parsed into four-bit groups for transmission as sixteen-level one-dimensional-constellation symbol coding, which transmissions are made without preceding.

The VSB signals have their natural carrier wave, which would vary in amplitude depending on the percentage of modulation, suppressed. The natural carrier wave is replaced by a pilot carrier wave of fixed amplitude, which amplitude corresponds to a prescribed percentage of modulation. This pilot carrier wave of fixed amplitude is generated by introducing a direct component shift into the modulating voltage applied to the balanced modulator generating the amplitude-modulation sidebands that are supplied to the filter supplying the VSB signal as its response. If the eight levels of 3-bit symbol coding have normalized values of –7, –5, –3, –1, +1, +3, +5 and +7 in the carrier modulating signal, the pilot carrier has a normalized value of 1.25. The normalized value of+S is+5, and the normalized value of–S is–5.

The VSB modulation transmitted to DTV receivers in accordance with the September 1995 standard differs from that transmitted to NTSC receivers in that the low-end roll-off of the vestigial sideband ends in the portion of the frequency spectrum containing the lower frequencies of the more complete sideband, with the overall channel response being reduced 3 dB at frequencies close to the frequency of the suppressed carrier. Insofar as the high-end roll-off of the complete sideband is concerned the overall channel response of VSB modulation transmitted to DTV receivers is already reduced 3 dB at frequencies close to baud rate. DTV receiver designs proposed by the Grand Alliance further reduce the overall channel response at upper frequencies offset from carrier close to baud rate; this high-end roll-off introduces a Nyquist slope limitation on overall channel response, which is desired for minimizing intersymbol interference (ISI). The DTV receiver designs proposed by the Grand Alliance introduce further low-end roll-off beginning in the portion of the frequency spectrum containing the lower frequencies of the more complete sideband. This further low-end roll-off reduces the response at carrier frequency by another 3 dB at frequencies close to the frequency of the suppressed carrier, to match the Nyquist slope roll-off. When the DTV signals are demodulated, the amplitude response of the demodulation result is essentially flat at frequencies close to zero frequency, easing problems with equalizing at lower frequencies of baseband symbol response.

Beginning the low-end roll-off below carrier frequency introduces other problems, however. The resultant asymmetry of passband affects the operation of phase lock loops, as used for automatic fine tuning (AFT) of the first local oscillator in the DTV receiver, and as used for phase tracking of synchronous detection to recover baseband symbol code. The passband asymmetry exacerbates the problem of carrier jitter that occurs when the DTV signals that are being synchronously detected have poor carrier-to-noise ratio.

A better design compromise for the DTV system, the inventor observes, is to roll off the vestigial sideband without reducing amplitude response through the region immediately surrounding carrier frequency. The resulting boost in baseband amplitude response near zero frequency can be taken care of by equalization filtering, which is required anyway for overcoming multipath distortion.

A description of the characteristics of undesirable artifacts that arise in ATSC DTV signals owing to co-channel interfering NTSC analog TV signals is included in U.S. Pat. No. 5,835,131 issued Nov. 10, 1998 to A. L. R. Limberg, titled "DIGITAL TELEVISION RECEIVER WITH ADAPTIVE FILTER CIRCUITRY FOR SUPPRESSING NTSC CO-CHANNEL INTERFERENCE", and incorporated herein by reference. U. S. Pat. No. 5,835,131 also describes comb filtering methods that will suppress these artifacts.

The compromise with best noise performance of a DTV signal receiver that is required with the comb filtering approach to suppressing the artifacts of NTSC co-channel interference was recognized early on by the proponents of the DTV signal specified in the Digital Television Standard published by the ATSC Sep. 16, 1995. The fact of two independent paths for signals being combined in the comb filtering used for suppressing these artifacts increases noise energy while signa energy is decreased to result in a reduction of signal-to-noise ratio.

The transmission of VSB modulation with the full sideband located higher in frequency than the vestigial problem has been found to have a number of further problems in regard to transmission and reception, now that more experience has been gained with the proposed system. Co-channel interference of ATSC DTV signals with NTSC analog TV signals and co-channel interference of NTSC analog TV signals with ATSC DTV signals have been found to be more serious problems than originally contemplated. Co-channel interference of NTSC signals with ATSC DTV signals disrupts channel equalization. The use of comb filters for suppressing artifacts of NTSC co-channel interference and the attempt to achieve channel equalization tend to work in opposite directions.

The upper frequency limit of the VSB modulation is too close in frequency to the frequency-modulated audio carrier of an interfering co-channel NTSC signal. It is extremely difficult to suppress the FM audio signal with frequency-selective filtering in the IF amplifiers of DTV signal receivers. If the lower sidebands of the FM audio signal are suppressed as much as a receiver designer would like them to be, the phase response at the shoulder of the IF amplifier amplitude response is affected. Since the VSB signal is in effect single sideband at the shoulder, phase error markedly affects synchronous detection results for a signal component that is critical when baud rate close to channel capacity is sought.

The predictably high spatial correlation of video signal components of NTSC co-channel interference facilitates the use of comb filtering in a DTV signal receiver to suppress artifacts arising from these video signal components. However, the FM audio signal component of the NTSC signal exhibits little correlation over delay intervals of more than a few symbol epochs. If the FM audio carrier has modulated ultrasonic subcarriers, as is generally the case in recent times, predictability of correlation is poor even over a few symbol epochs. So, comb filtering is not a reliable way to reduce artifacts of NTSC FM sound carrier in a DTV signal receiver. The use of modulated ultrasonic subcarriers in the NTSC FM audio signal makes it impractical to use a tracking filter in a DTV signal receiver for suppressing that signal. A primary objective of the inventor was to mitigate the problems of co-channel interference from the FM audio signal component of the NTSC signal.

SUMMARY OF THE INVENTION

The inventive insight is that one can build a DTV signal receiver in which artifacts of the FM audio signal component of a co-channel NTSC signal do not appear, provided that the VSB modulation of the DTV signal (a) is not rolled off in the frequency region flanking carrier frequency and (b) is reversed so the DTV carrier is closer to the upper limit frequency of the channel than to its lower limit frequency. The vestigial sideband of the DTV signal is caused to overlap in frequency the FM audio signal component of a co-channel NTSC signal, and the full sideband of the DTV signal is located below the vestigial sideband in the frequency spectrum. An aspect of the invention is modifying the transmission of the DTV signal in this way.

Another aspect of the invention is a DTV signal receiver designed to receive these modified transmissions of DTV signal by synchronously detecting the DTV signal and then equalizing the resulting baseband DTV signal. Such a DTV signal receiver, because of the double-sideband (DSB) nature of the signal at lower modulation frequencies, reduces by 6 dB the artifacts generated by the audio signal of NTSC co-channel interference as compared to a similar receiver designed to receive the ATSC DTV signal.

Another aspect of the invention is embodied in a DTV signal receiver for receiving the modified transmissions of DTV signal, in which DTV signal receiver artifacts of the FM audio signal component of a co-channel NTSC signal do not appear. The DTV signal receiver includes a complex demodulator that recovers in-phase and quadrature-phase baseband signals. The in-phase baseband signal is composed of the regenerated DTV symbol coding, including low-frequency components thereof, and artifacts of co-channel interfering NTSC. The quadrature-phase baseband signal is composed of Hilbert transforms of the regenerated DTV symbol coding, excluding low-frequency components thereof, and artifacts of co-channel interfering NTSC. The quadrature-phase baseband signal is applied to an inverse-Hilbert-transform filter to recover the regenerated DTV symbol coding, excluding low-frequency components thereof, and artifacts of co-channel interfering NTSC. The components of this inverse-Hilbert-transform filter response are, except for the latency of the inverse-Hilbert-transform filter, the same as corresponding components of the in-phase baseband signal. The inverse-Hilbert-transform filter response is applied to a band separation filter that supplies a lowpass response and a highpass response. The lowpass response selects the artifacts of the audio signal component of co-channel interfering NTSC from the inverse-Hilbert-transform filter response, and the highband response selects the high-frequency components of regenerated DTV symbol coding from the inverse-Hilbert-transform filter response. The in-phase baseband signal is subjected to delay that compensates for the latencies of the inverse-Hilbert-transform filter and of the band separation filter. The delayed in-phase baseband signal has the lowpass response of the band separation filter combined therewith to cancel artifacts of the audio signal component of co-channel interfering NTSC and has the highpass response of the band separation filter combined therewith to boost the high-frequency components of the regenerated DTV symbol coding in the delayed in-phase baseband signal to the same gain level as the low-frequency components of the regenerated DTV symbol coding therein. The delayed in-phase baseband signal as so modified is a symbol coding stream with reasonably constant gain across baseband up to 5.5 MHz or so, which is supplied to channel equalization and symbol synchronizer circuitry. The response of the channel equalization and symbol synchronizer circuitry is supplied to a symbol decoder and is essentially free of artifacts of the audio signal component of co-channel interfering NTSC.

Another aspect of the invention is that a DTV signal receiver designed to receive these modified transmissions of DTV signal can use trap filtering for NTSC video carrier and lower-frequency modulation thereof in its intermediate-frequency amplifier circuitry without appreciably affecting the capability of the receiver for receiving DTV transmissions. This is facilitated because there is less crowding of critical frequencies of the DTV modulation at the lower-frequency end of the TV transmission channel when the carrier is placed near the upper limit frequency of that channel. There can also be trap filtering in the DTV signal receiver IF amplifier circuitry for NTSC chroma subcarrier and lower-frequency modulation thereof.

Another aspect of the invention is that, in a DTV signal receiver designed to receive the modified transmissions of DTV signal, choosing the DTV carrier frequency to be about 270 kHz below the upper limit frequency of the TV transmission channel facilitates the use of comb filtering to suppress NTSC chroma subcarrier and lower-frequency modulation thereof and to suppress NTSC video carrier and lower-frequency modulation thereof.

BRIEF DESCRIPTION OF THE DRAWING

FIGS. 5 and 6 are each a diagram of amplitude-versus-frequency response of SAW filtering that can be used in the DTV signal receiver of FIG. 1 when the introduction of Nyquist slop to minimize ISI is completed by SAW filtering in that DTV signal receiver.

DETAILED DESCRIPTION

Figure 1:
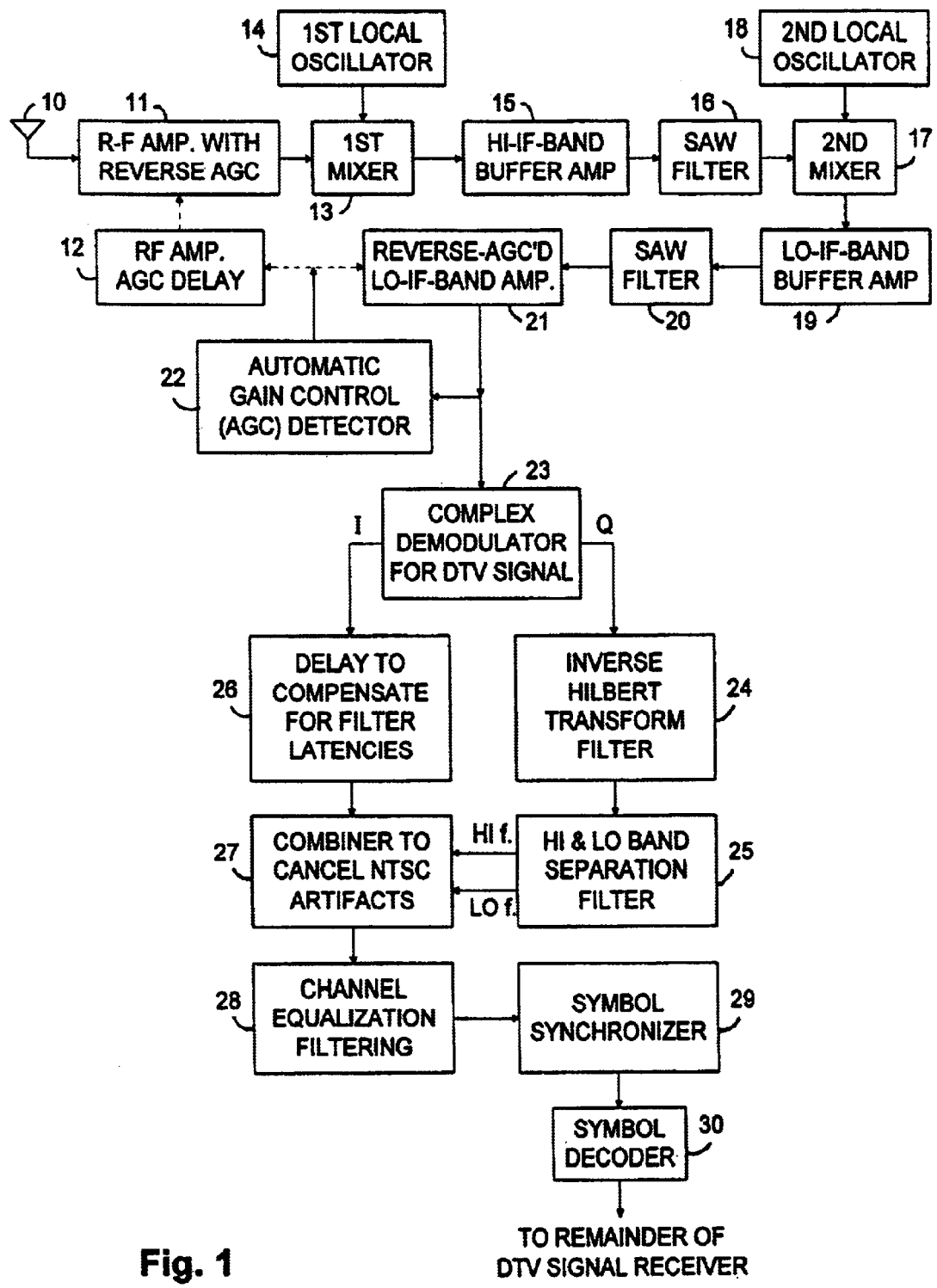
FIG. 1 is a schematic diagram of a DTV signal receiver embodying the invention.

FIG. 1 shows the radio receiver portions of a DTV receiver constructed in accordance with the invention. An antenna 10 is a representative source of TV signals in ultra high frequency (UHF) band, or possibly in the very high frequency (VHF) band, which TV signals are applied to a As radio frequency (RF) amplifier 11. The RF amplifier 11 is provided with a tracking preselection filter for selecting a portion of the one of the television broadcast bands in which the television signal selected for reception reposes. The RF amplifier 11 is reverse-AGC'd in delayed response to AGC signals applied to RF amplifier 11 via an AGC delay circuit 12. The RF amplifier 111 supplies amplified response to the television signal selected for reception.

This amplified response is supplied to a first mixer 13 to be mixed with a super-heterodyning signal from a first local oscillator 14 for upconversion to a high intermediate-frequency-band, which is above the highest frequency television channel in the ultra-high frequency (UHF) spectrum in line with current TV practice, the first local oscillator 14 is usually a frequency synthesizer for generating the super-heterodyning signal of a frequency in selected ratio with the frequency of a component controlled oscillator, with the frequency of the controlled oscillator being controlled by AFT signal. This preferred practice results in the sensitivity of the super-heterodyning signal frequency to AFT signal being substantially the same for all received TV channels. The 6-MHz-wide selected radio-frequency signal supplied by the RF amplifier 11 is upconverted to a high-band intermediate-frequency signal in the output signal from the first mixer 13, which preferably is of a doubly-balanced linear-multiplication type. The high-band intermediate-frequency signal is centered at an ultra-high frequency above that portion of the UHF band containing assigned channels for television broadcasting, placing the image frequencies well above 1 GHz so they are easily rejected by a bandpass coupling network at the output of the first mixer 13.

A high-intermediate-frequency-band buffer amplifier 15 applies the high-band IF signal to a surface-acoustic-wave (SAW) filter 16. The buffer amplifier 15 provides fixed gain to make up the 10–12 dB insertion loss of the SAW filter 16 and drives the SAW filter 16 from a fixed source impedance chosen to avoid unwanted reflections. The SAW filter 16 has a response that extends on either side of a midband frequency in the UHF band, which frequency can be can be about 916 MHz, for example. A gallium arsenide SAW filter 16 can be operated satisfactorily in this frequency range. The response of the SAW filter 16 is supplied to a second mixer 17 for downconversion to a low-band intermediate-frequency signal centered at a very high frequency below that portion of the VHF band containing assigned channels for television broadcasting. The low-band IF signal can be centered at about 44 MHz, as common in analog TV practice. A local oscillator 18, which is preferably of a crystal-controlled type, supplies a heterodyning signal of stable fixed frequency to the second mixer 17 for implementing the downconversion therein. The second mixer 17 is preferably of a doubly-balanced linear-multiplication type.

A low-intermediate-frequency-band buffer amplifier 19 applies the low-band IF signal to a surface-acoustic-wave (SAW) filter 20, which preferably is designed for flat response over at least a 6 MHz bandwidth. The buffer amplifier 19 provides fixed gain to make up the 10–12 dB insertion loss of the SAW filter 20 and drives the SAW filter 20 from a fixed source impedance chosen to avoid unwanted reflections. The SAW filter 20 has a substantially linear-phase response over a bandwidth in excess of 6 MHz, so that the earlier SAW filter 16 determines the channel characteristics of the IF amplifier chain. A lithium niobate SAW filter 20 can be operated satisfactorily in the frequency range centered at about 44 MHz. The response of the SAW filter 20 is supplied as input signal to a low-intermediate-frequency-band (VHF) amplifier 21, the gain of which can be controlled. The response of the controlled-gain IF amplifier 21 is supplied to an automatic gain control detector 22, which applies automatic gain control (AGC) signals to the controlled-gain IF amplifier 21 and to the AGC delay circuit 12. Reverse AGC is preferred, better to preserve linearity of the DTV signals.

The response of the controlled-gain IF amplifier 21 is supplied to a complex demodulator 23 for VSB DTV signal, which demodulator 23 generates a real digital demodulation response to the in-phase modulation of the VSB AM carrier and an imaginary digital demodulation response to the quadrature-phase modulation of the VSB AM carrier. In the lower frequency range of demodulation results derived from the portion of the VSB AM carrier that is double-sideband (DSB) in nature, the real digital demodulation response to VSB DTV signal will have substantially more gain than in the upper frequency range of demodulation results derived from the portion of the VSB AM carrier that is single-sideband (SSB) in nature. The difference in the gains that the real digital demodulation response to VSB DTV signal has in the lower and upper ranges has been compensated for by channel equalization filtering in some prior-art DTV signal receivers. In the lower frequency range of demodulation results derived from the portion of the VSB AM carrier that is DSB in nature, the imaginary digital demodulation response to VSB DTV signal will have zero energy. In the upper frequency range of demodulation results derived from the portion of the VSB AM carrier that is SSB in nature, the imaginary digital demodulation response to VSB DTV signal will have appreciable energy and corresponds to the Hilbert transform of the real digital demodulation response in its corresponding upper frequency range.

The complex demodulator 23 may be one in which a third local oscillator supplies in-phase and quadrature-phase oscillations to respective mixers used to synchrodyne the response of the controlled-gain IF amplifier 21 to baseband in the analog regime. The real demodulation response resulting from the synchrodyne with in-phase oscillations from the third local oscillator is then digitized by a respective analog-to-digital converter to obtain the real digital demodulation response. And the imaginary demodulation response resulting from the synchrodyne with quadrature-phase oscillations from the third local oscillator is then digitized by a respective analog-to-digital converter to obtain the imaginary digital demodulation response. Alternatively, as described by C. B. Patel et alii in U. S. Pat. No. 5,479,449 issued Dec. 26, 1995 and entitled"DIGITAL VSB DETECTOR WITH BANDPASS DIGITAL VSB DETECTOR WITH BANDPASS PHASE TRACKER, AS FOR INCLU-SION IN AN HDTV RECEIVER", the complex demodulator 23 may be one in which the response of the controlled-gain IF amplifier 21 is converted to an intermediate-frequency band centered at 4 or 5 MHz and digitized by a sole analog-to-digital converter, after which synchrodyning is carried out in the digital regime to obtain the real and imaginary digital demodulation responses. In still other arrangements the complex demodulator 23 may be one in which the response of the controlled-gain IF amplifier 21 is synchrodyned to baseband attendant to analogto-digital conversion.

Essentially, an NTSC co-channel interfering signal does not have a symmetric DSB structure insofar as the DTV carrier frequency is concerned. Therefore, artifacts of an NTSC co-channel interfering signal appear in both the lower and upper frequency ranges of the real digital demodulation response to VSB DTV signal; and artifacts of that NTSC co-channel interfering signal also appear in both the lower and upper frequency ranges of the imaginary digital demodulation response to VSB DTV signal, which artifacts in the imaginary digital demodulation response are Hilbert transforms of the artifacts in the real digital demodulation response.

An inverse-Hilbert-transform filter 24 is connected to respond to the imaginary digital demodulation response from the complex demodulator 23. Except for the delay introduced by the latency of the inverse-Hilbert-transform filter 24, the response of the filter 24 corresponds to the artifacts of the NTSC co-channel interfering signal as they appear in the real digital demodulation response, admixed with the upper frequency range of the real digital demodulation response to VSB DTV signal. The response of the filter 24 is supplied as input signal to a band separation filter 25, which supplies a lowband response to the artifacts of the NTSC co-channel interfering signal in the lower frequency range and supplies a highband response to the components of the DTV baseband signal and the artifacts of the NTSC co-channel interfering signal in the upper frequency range.

The real digital demodulation response from the complex demodulator 23 is supplied to digital delay circuitry 26 to be delayed for a period of time corresponding to the combined latencies of the filters 24 and 25, and the resulting delayed real digital demodulation response is supplied to a combiner 27. The digital delay circuitry 26 can be constructed as first-in/first-out (FIFO) digital memory. The combiner 27 includes a digital adder and a digital subtractor, neither of which elements is specifically shown in FIG. 1. The digital adder receives the highband response from the band separation filter 25 and is connected for augmenting the combiner 27 response to the delayed real digital demodulation response with that highband response. The digital subtractor receives the lowband response from the band separation filter 25 and is connected for canceling from the combiner 27 response to the delayed real digital demodulation response, the artifacts of the NTSC co-channel interfering signal in the lower frequency range.

The combiner 27 response accordingly supplies symbol coding essentially free of artifacts of the audio signal component of any NTSC co-channel interference. This symbol coding is supplied to channel equalization filtering 28, which supplies its response to a symbol synchronizer 28. After channel equalization and symbol synchronization the symbol coding is supplied to symbol decoder circuitry 30 to recover a bitstream forwarded to remaining portions of the DTV signal receiver per customary practice in the art. The augmentation of the delayed real digital demodulation response with the highband response from the band separation filter 25 reduces the amount of boost in the upper frequency range that the channel equalization filtering 28 is called upon to provide.

Figure 2:
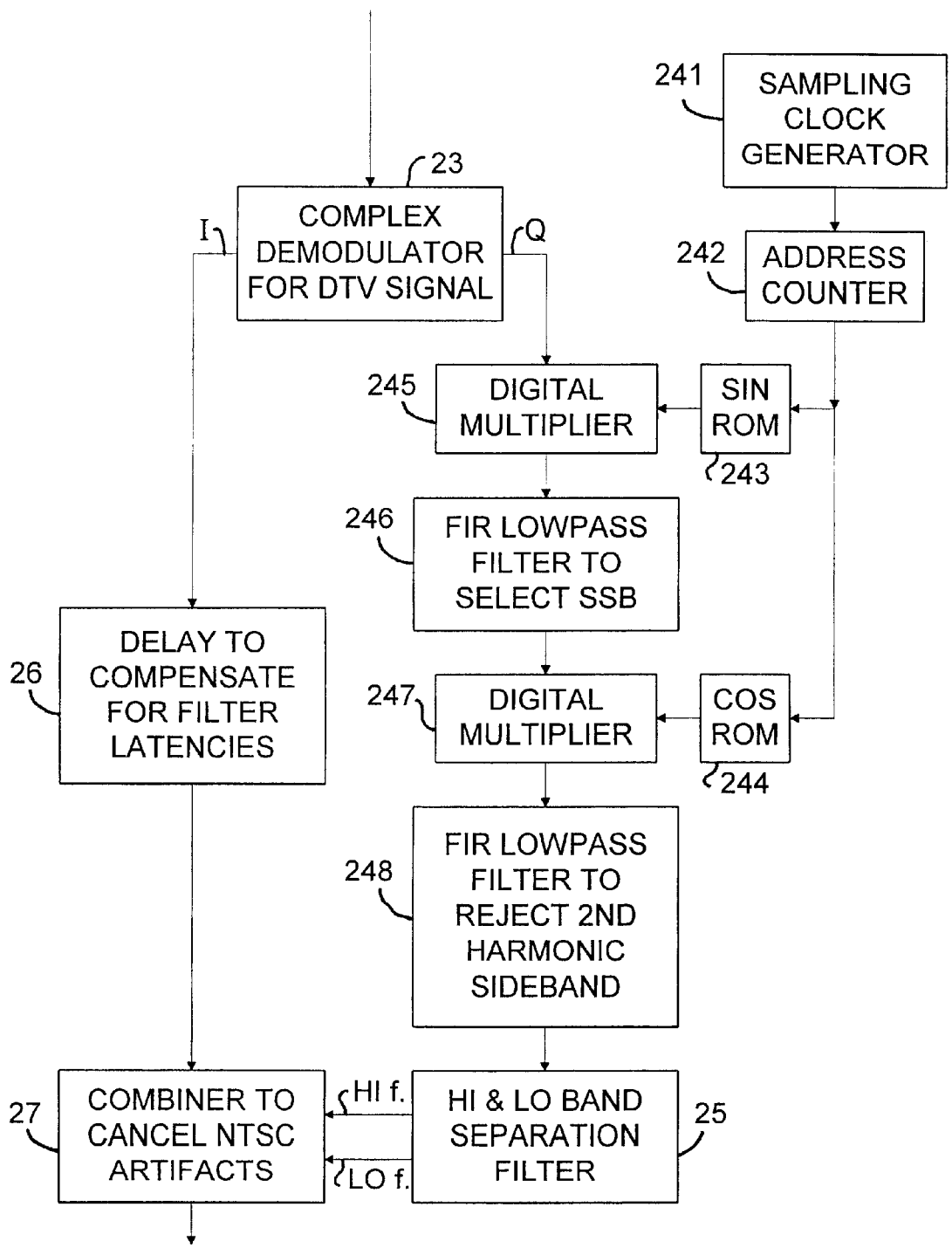
FIG. 2 shows details of a particular inverse Hilbert transform filter that is well suited for use in the DTV signal receiver of FIG. 1.

FIG. 2 shows in detail a specific construction of the inverse-Hilbert-transform filter 24 comprising elements 241–248, which construction is preferred because its latency time can be kept reasonably short. If one attempts to construct an inverse-Hilbert-transform filter at baseband, the delays associated with obtaining a 90° shift at low frequencies becomes prohibitively long. Therefore, the imaginary digital demodulation response from the complex demodulator 23 is upconverted in frequency before inverse Hilbert transform filtering, and the results of the inverse Hilbert transform filtering are then downconverted in frequency to provide an inverse-Hilbert-transformed imaginary digital demodulation response at baseband. A sampling clock generator 241 generates the sampling clock that controls digitization of the real and imaginary responses of the complex demodulator 23. Sampling periods in the sampling clock are counted by an address counter 242 to generate consecutive addresses in a modular arithmetic for addressing a sine-table read-only memory 243 and a cosine-table read-only memory 244. The sine-table ROM 243 responds to its addressing to generate a digital carrier wave at a frequency more than 6 MHz (such as 8071678 Hz) =513/286 times 4.5 MHz, for example) applied as multiplier input signal to a digital multiplier 245. The digital multiplier 245 is connected to receive the imaginary digital demodulation response from the complex demodulator 23 as multiplicand input signal and to upconvert that signal to amplitude modulation sidebands of a double-sideband amplitude-modulated digital carrier wave. The digital multiplier 245 is connected to apply this DSB AM digital carrier wave to a finite-impulse-response (FIR) lowpass digital filter 246 as an input signal. Filter 246 is designed to be responsive to the lower-frequency AM sideband to supply a single-sideband amplitude-modulated (SSB AM) digital carrir wave, but to be essentially non-responsive to the upper-frequency AM sideband. The cosine-table ROM 244 responds to its addressing to generate a digital carrier wave at the same frequency as that generated from the sine-table ROM 243, but in quadrature phase therewith. A digital multiplier 247 is connected to receive the digital carrier wave generated from the cosine-table ROM 244 as its multiplier input signal and the SSB AM digital carrier wave response from the filter 246 as muiltiplicand input signal. The digital multiplier 247 is connected to apply its product output signal as an input signal to a finite-impulse-response (FIR) lowpass digital filter 248, which responds to a baseband downconversion result portion of that product signal while rejecting the image upconversion result portion of that product signal to sidebands of a second harmonic of the digital carrier wave supplied from the cosine-table ROM 244. The baseband response of the lowpass filter 248 is the inverse-Hilbert-transformned imaginary digital demodulation response applied to the band separation filter 25 as its input signal.

Referring back to the DTV signal receiver of FIG. 1, the reversal of the frequency spectrum of the DTV signal reduces the number of frequency components critical to reproducing the symbol code variations with reasonable accuracy in the portion of the transmission channel that the video carrier of an NTSC co-channel interfering signal and its lower modulating frequencies are apt to fall. This permits the SAW filter 16 to be designed for trap filtering the video carrier of an NTSC co-channel interfering signal and its lower modulating frequencies without impairing DTV transmissions to such a degree that they cannot be restored by the channel equalization filtering 28.

Figure 3:
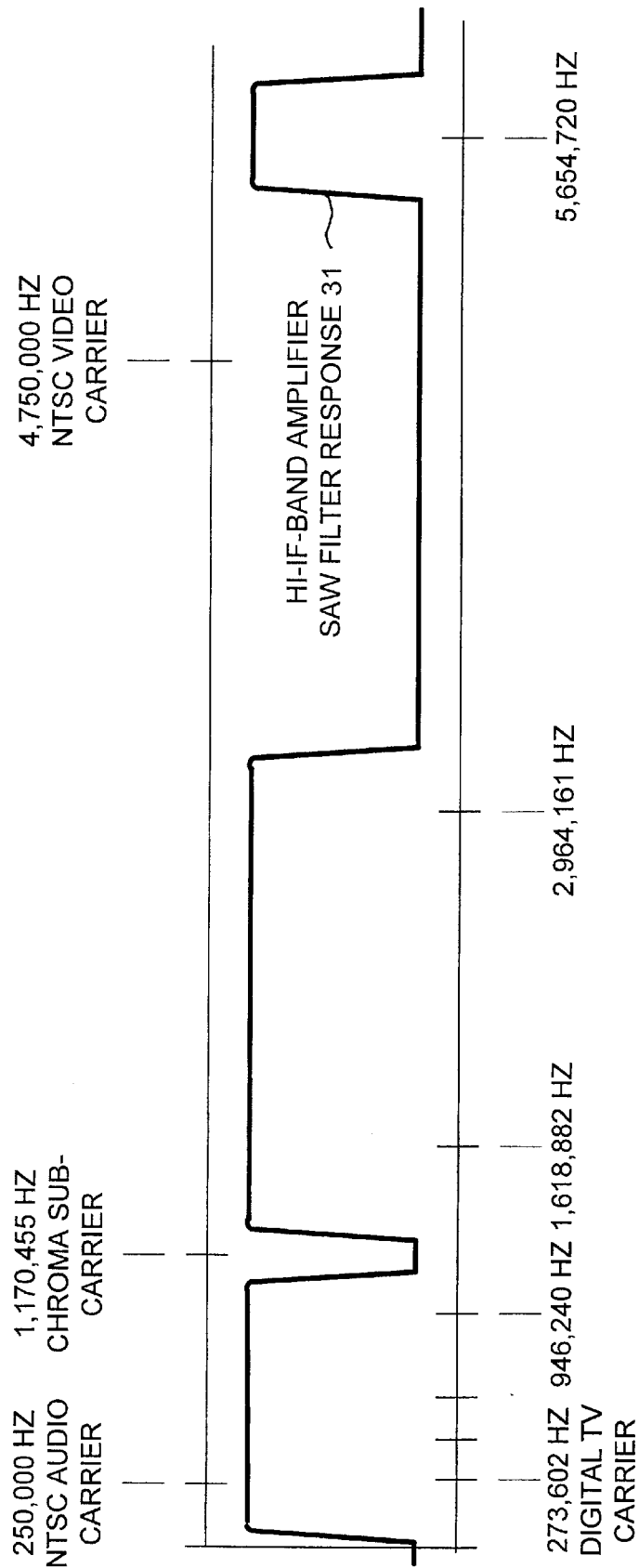
FIGS. 3 and 4 are each a diagram of amplitude-versus-frequency response of SAW filtering that can be advantageously used in the DTV signal receiver of FIG. 1.
Figure 4:
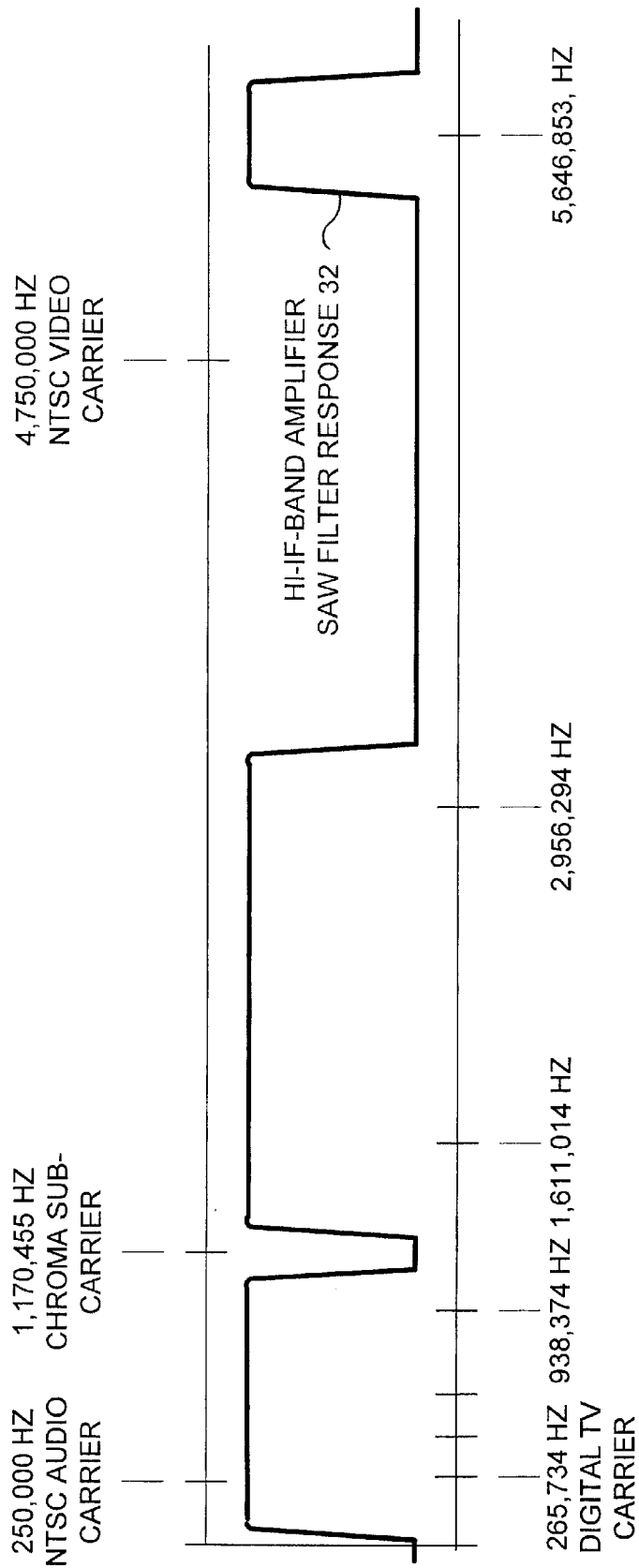

FIGS. 3 and 4 plot IF amplifier response to the VSB DTV signal transmitted with carrier near the upper limit frequency of the transmission channel and converted to UHF by superheterodyne, which IF response is normalized to baseband so the converted upper limit frequency of the transmission channel is at zero frequency. The normalized IF amplifier response should be added to a UHF offset of 917 MHz or so to show actual SAW filter 16 response. The responses 31 and 32 of SAW filter 16 respectively shown in FIG. 3 and in FIG. 4 each include a wide notch between the first and second subharmonics of symbol frequency in the VSB DTV signal, which subharmonics are offset from 5.38 MHz and 2.39 MHz respectively by the DTV carrier frequency. This notch traps the video carrier (with 4,750,000 Hz normalized frequency) and its nearby amplitude-modulation sidebands incorporated within any NTSC co-channel interference. This notch also traps a considerable amount of the Johnson noise from the RF amplifier 11. The responses 31 and 32 of SAW filter 16 respectively shown in FIG. 3 and in FIG. 4 each include another notch between the third and fourth subharmonics of symbol frequency in the VSB DTV signal, which subharmonics are offset from 1.345 MHz and 0.673 MHz respectively by the DTV carrier frequency. This notch traps the chroma subcarrier (with 1,170,455 Hz normalized frequency) and its nearby amplitude-modulation sidebands incorporated within any NTSC co-channel interference.

FIG. 3 presumes the DTV carrier to be placed at 273,602 Hz, which is 57 times NTSC horizontal scan line frequency below the 1,170,455 Hz NTSC chroma subcarrier frequency. This DTV carrier facilitates comb filtering being used to suppress the NTSC chroma subcarrier and its nearby amplitude-modulation sidebands if one chooses. The comb filter used to suppress the chroma subcarrier and its nearby AM sidebands may additively combine signals with six-symbol differential delay, may subtractively combine signals with 12-symbol differential delay, may subtractively combine signals with 684-symbol (1-NTSC-scan-line) differential delay, may subtractively combine signals with 263-NTSC-scan-line differential delay or may subtractively combine signals with 1-NTSC-frame differential delay. Such comb filtering will also suppress the NTSC video carrier and its nearby amplitude-modulation sidebands to considerable degree. Such comb filtering will also afford rejection of remnants of the NTSC FM audio carrier near the DTV carrier frequency easing the requirements on filtering in the inverse-Hilbert-transform filter 24.

FIG. 4 presumes the DTV carrier to be placed at 265,734 Hz, which is 5*57 times NTSC horizontal scan line frequency below the 4,750,000 Hz NTSC video carrier frequency. This DTV carrier facilitates comb filtering being used to suppress the NTSC video carrier and its nearby amplitude-modulation sidebands if one chooses. The comb filter used to suppress the NTSC video carrier and its nearby AM sidebands may additively combine signals with six-symbol differential delay, may subtractively combine signals with 12-symbol differential delay, may subtractively combine signals with 684-symbol (1-NTSC-scan-line) differential delay, may subtractively combine signals with 263-NTSC-scan-line differential delay or may subtractively combine signals with 1-NTSC-frame differential delay. Such comb filtering will also suppress the NTSC chroma subcarrier and its nearby amplitude-modulation sidebands to considerable degree. Such comb filtering will also afford rejection of remnants of the NTSC FM audio carrier near the DTV carrier frequency easing the requirements on filtering in the inverse-Hilbert-transform filter 24.

The data carrier can be placed better to interleave with co-channel NTSC signals, but this will adversely affect line-to-line comb filtering. For example, the data carrier can be offset from NTSC chroma subcarrier by 56.75 times the horizontal scan line rate of the NTSC analog TV signal, to place the carrier of the DTV signal at about 277,535 Hz from channel edge.

Figure 5:
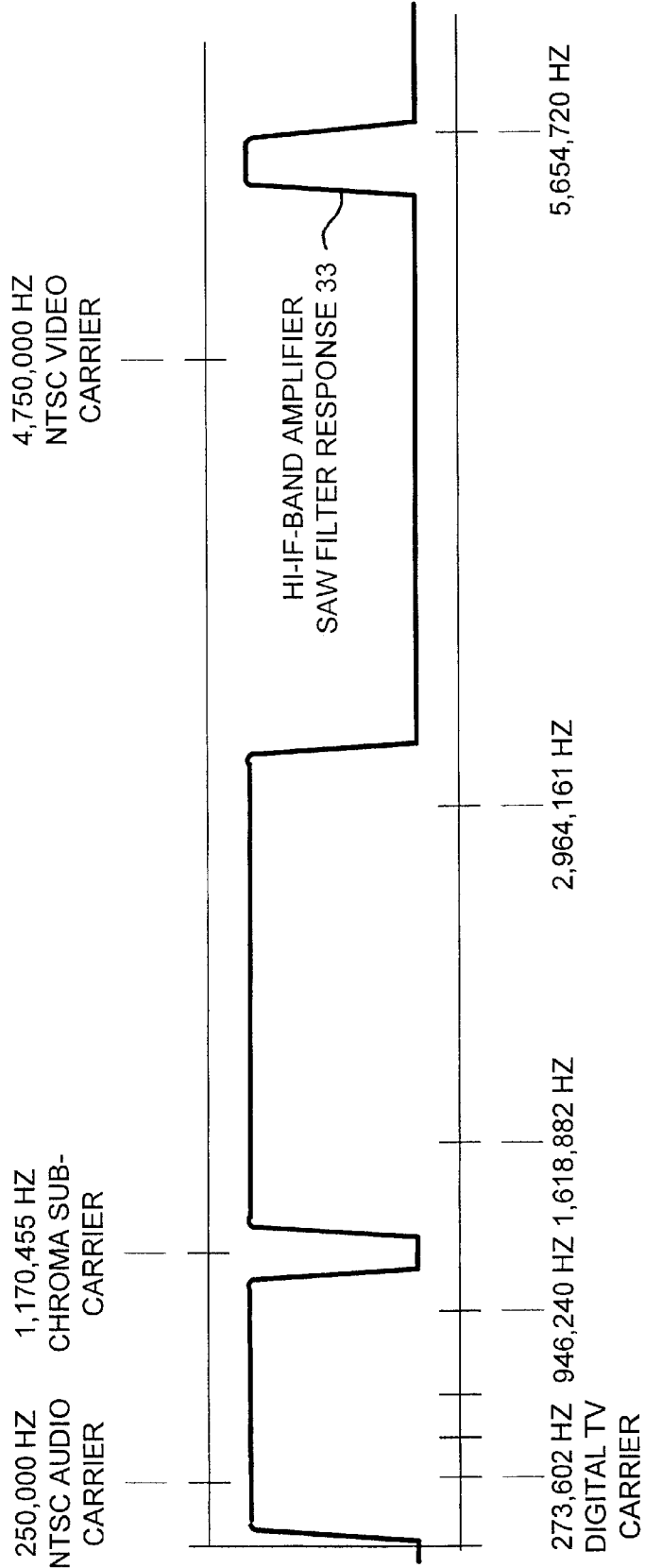

FIG. 5 is a diagram of the amplitude-versus-frequencyresponse 33 of SAW filtering that can be used in the DTV signal receiver of FIG. 1 instead of SAW filtering having the amplitude-versus-frequency response 31 shown in FIG. 3. The amplitude-versus-frequency response 33 of FIG. 5 presumes that the introduction of Nyquist slope to minimize intersymbol interference is completed by the SAW filtering in the DTV receiver. Overall channel response is caused to be 6 dB down at a frequency 5.381119 MHz removed from DTV signal carrier.

FIG. 6 is a diagram of the amplitude-versus-frequency response of SAW filtering 34 that can be used in the DTV signal receiver of FIG. 1 instead of SAW filtering having the amplitude-versus-frequency response 32 shown in FIG. 4. The amplitude-versus-frequency response 34 of FIG. 6 presumes that the introduction of Nyquist slope to minimize intersymbol interference is completed by the SAW filtering in the DTV receiver. Overall channel response is caused to be 6 dB down at a frequency 5.381119 MHz removed from DTV signal carrier.

The DTV receiver circuitry of FIGS. 1 and 2 can also be used in DTV receivers that embody only certain aspects of the invention and that have intermediate-frequency amplifiers with passbands that are substantially flat in amplitude. That is, the passbands do not include in-band trap filtering for NTSC analog television signal components apt to have high energy.

Intermediate-frequency amplifiers with passbands that include in-band trap filtering for NTSC analog television signal components apt to have high energy can also be useful in DTV systems in which the carrier is located near the lower limit frequency of a 6-MHZ-wide transmission channel that is also used for transmitting NTSC analog television signal.

What is claimed is:

1. A radio receiver for a vestigial sideband digital television signal in which a frequency spectrum of a vestigial sideband is rolled off at some point removed from a suppressed carrier, and a pilot carrier is transmitted at a frequency of the suppressed carrier, said vestigial sideband digital television signal at times being undesirably accompanied by a co-channel analog television signal, said radio receiver comprising:

tuner circuitry for supplying an intermediate-frequency signal in response to said vestigial side and digital television signal;

co-channel interference filter circuitry selectively responsive to frequencies in said intemediate-frequency signal containing most of energy of said vestigial sideband digital television signal for suppressing intervening frequencies in said intermediate-frequency signal containing little of the energy of said vestigial sideband digital television signal, but apt to contain a substantial portion of energy of said co-channel analog television signal;

a complex demodulator for supplying in-phase and quadrature-phase synchronous detection responses to said intermediate-frequency signal;

Hilbert transformation circuitry for supplying a Hilbert transform response to said quadrature-phase synchronous detection response;

filter circuitry for separating a low-frequency portion of said Hilbert transform response; and a combiner for combining said low-frequency portion of said Hilbert transform response with said in-phase synchronous detection response, and for suppressing demodulation artifacts of said co-channel analog television signal that otherwise accompany said in-phase synchronous detection response in a combiner output signal.

2. The radio receiver of claim 1, wherein said filter circuitry for separating the low frequency portion of said Hilbert transform response also separates a high-frequency portion of said Hilbert transform response, and wherein said combiner also combines said high-frequency portion of said Hilbert transform response with said in-phase synchronous detention response to increase the high frequency content of said combiner output signal.

3. The radio receiver of claim 2, further comprising:

channel equalization filtering for supplying an equalized channel response to said combiner output signal.

4. A radio receiver for a vestigial sideband digital television signal in which the frequency spectrum of the vestigial sideband is rolled off at some point removed from the suppressed carrier, and a pilot carrier is transmitted at a frequency of the suppressed carrier, said vestigial sideband digital television signal at times being undesirably accompanied by a co-channel analog television signal, said radio receiver comprising:

tuner circuitry for supplying an intermediate-frequency signal in response to said vestigial sideband digital television signal;

a complex demodulator for supplying in-phase and quadrature-phase synchronous detection responses to said intermediate-frequency signal;

Hilbert transformation circuitry for supplying a Hilbert transform response to said quadrature-phase synchronous detection response;

filter circuitry for separating a low-frequency portion of said Hilbert transform response; and a combiner for combining said low-frequency portion of said Hilbert transform response with said in-phase synchronous detection response, and for suppressing demodulation artifacts of said co-channel analog television signal that otherwise accompany said in-phase synchronous detection response in a combiner output signal.

5. The radio receiver of claim 4, wherein said filter circuitry for seperating the low frequency portion of said Hilbert transform response also separates a high-frequency portion of said Hilbert transform response, and wherein said combiner also combines said high-frequency portion of said Hilbert transform response with said in-phase synchronous detection response to increase the high frequency content of said combiner output signal.

6. The radio receiver of claim 5, further comprising:

channel equalization filtering for supplying an equalized channel response to said combiner output signal.

7. A radio receiver for a vestigial sideband digital television signal, comprising:

tuner circuitry for supplying an intermediate-frequency signal in response to said vestigial sideband digital television signal;

a complex demodulator for supplying in-phase and quadrature-phase synchronous detection responses to said intermediate-frequency signal;

Hilbert transformation circuitry for supplying a Hilbert transform response to said quadrature-phase synchronous detection response;

filter circuitry for separating a low-frequency portion of said Hilbert transform response; and a combiner for combining said low-frequency portion of said Hilbert transform response with said in-phase synchronous detection response, and for suppressing demodulation artifacts of a co-channel analog television signal that otherwise accompany said in-phase synchronous detection response in a combiner output signal.

8. The radio receiver of claim 7, wherein said filter circuitry for seperating the low frequency portion of said Hilbert transform response also separates a high-frequency portion of said Hilbert transform response, and wherein said combiner also combines said high-frequency portion of said Hilbert transform response with said in-phase synchronous detection response to increase the high frequency content of said combiner output signal.

9. The radio receiver of claim 8, further comprising:

channel equalization filtering for supplying an equalized channel response to said combiner output signal.

10. The radio receiver of claim 7, wherein the frequency spectrum of the vestigial sideband is rolled off at some point removed from a suppressed carrier, and a pilot carrier is transmitted at a frequency of the suppressed carrier, said vestigial sideband digital television signal at times being undesirably accompanied by a co-channel analog television signal.

11. A radio receiver for a vestigial sideband digital television signal in which a frequency spectrum of a vestigial sideband is rolled off at some point removed from a suppressed carrier, and a pilot carrier is transmitted at a frequency of the suppressed carrier, said vestigial sideband digital television signal at times being undesirably accompanied by a co-channel analog television signal, said radio receiver comprising:

tuner circuitry for supplying an intermediate-frequency signal in response to said vestigial sideband digital television signal;

co-channel interference filter circuitry selectively responsive to frequencies in said intermediate-frequency signal containing most of energy of said vestigial sideband digital television signal for suppressing intervening frequencies in said intermediate-frequency signal containing little of the energy of said vestigial sideband digital television signal, but apt to contain a substantial portion of energy of said co-channel analog television signal;

a complex demodulator for supplying in-phase and quadrature-phase synchronous detection responses to said intermediate-frequency signal;

Hilbert transformation circuitry for supplying a Hilbert transform response to said quadrature-phase synchronous detection response;

filter circuitry for separating at least one of a low-frequency portion of said Hilbert transform response and a high-frequency portion of said Hilbert transform response; and a combiner for combining said at least one of said low-frequency portion of said Hilbert transform response and said high-frequency portion of said Hilbert transform response with said in-phase synchronous detection response.

12. The radio receiver of claim 11, wherein said filter circuitry seperates said low-frequency portion of said Hilbert transform response, and said combiner combines said low-frequency portion of said Hilbert transform response with said in-phase synchronous detection response, and suppresses demodulation artifacts of said co-channel analog television signal that otherwise accompany said in-phase synchronous detection response in a combiner output signal.

13. The radio receiver of claim 12, wherein said filter circuitry also seperates said high-frequency portion of said Hilbert transform response, and wherein said combiner also combines said high-frequency portion of said Hilbert transform response with said in-phase synchronous detection response to increase the high frequency content of said combiner output signal.

14. The radio receiver of claim 13, further comprising:

channel equalization filtering for supplying an equalized channel response to said combiner output signal.

15. A radio receiver for a vestigial sideband digital television signal, comprising:

tuner circuitry for supplying an intermediate-frequency signal in response to said vestigial sideband digital television signal;

a complex demodulator for supplying in-phase and quadrature-phase synchronous detection responses to said intermediate-frequency signal;

Hilbert transformation circuitry for supplying a Hilbert transform response to said quadrature-phase synchronous detection response; and high and low band separation filter circuitry connected directly to said Hilbert transformation circuitry for separating at least one of a low-frequency portion of said Hilbert transform response and a high-frequency portion of said Hilbert transform response.

16. The radio receiver of claim 15, wherein said filter circuitry separates said low-frequency portion of said Hilbert transform response;

said receiver further comprising a combiner for combining said low-frequency portion of said Hilbert transform response with said in-phase synchronous detection response, and for suppressing demodulation artifacts of a co-channel analog television signal that otherwise accompany said in-phase synchronous detection response in a combiner output signal.

17. The radio receiver of claim 16, wherein said filter circuitry also separates said high-frequency portion of said Hilbert transform response, and wherein said combiner also combines said high-frequency portion of said Hilbert transform response with said in-phase synchronous detection response to increase the high frequency content of said combiner output signal.

18. The radio receiver of claim 17, further comprising:

channel equalization filtering for supplying an equalized channel response to said combiner output signal.

19. The radio receiver for a vestigial sideband digital television signal as set forth in claim 15, comprising:

a frequency spectrum of the vestigial sideband rolled off at a point removed from a suppressed carrier; and a pilot carrier transmitted at a frequency of the suppressed carrier.

20. The radio receiver of claim 15, wherein the frequency spectrum of the vestigial sideband is rolled off at some point removed from a suppressed carrier, and a pilot carrier is transmitted at a frequency of the suppressed carrier, said vestigial sideband digital television signal at times being undesirably accompanied by a co-channel analog television signal.

21. A radio receiver for a vestigial sideband digital television signal in which a frequency spectrum of a vestigial sideband is rolled off at some point removed from a suppressed carrier, and a pilot carrier is transmitted at a frequency of the suppressed carrier, said vestigial sideband digital television signal at times being undesirably accompanied by a co-channel analog television signal, said radio receiver comprising:

tuner circuitry for supplying an intermediate-frequency signal in response to said vestigial sideband digital television signal;

a complex demodulator for supplying in-phase and quadrature-phase synchronous detection responses to said intermediate-frequency signal;

a digital delay circuit for receiving and delaying the in-phase synchronous detection response to produce a delay output;

inverse Hilbert transformation circuitry for supplying an inverse Hilbert transform response to said quadrature-phase synchronous detection response;

filter circuitry for separating at least one of a low-frequency portion of said inverse Hilbert transform response and a high-frequency portion of said inverse Hilbert transform response; and a combiner for combining said at least one of said low-frequency portion of said inverse Hilbert transform response and said high-frequency portion of said inverse Hilbert transform response with said in-phase synchronous detection response.

22. The radio receiver of claim 21, further comprising co-channel interference filter circuitry selectively responsive to frequencies in said intermediate-frequency signal containing most of energy of said vestigial sideband digital television signal for suppressing intervening frequencies in said intermediate-frequency signal containing little of the energy of said vestigial sideband digital television signal, but apt to contain a substantial portion of energy of said co-channel analog television signal.

23. The radio receiver of claim 21, wherein said filter circuitry separates said low-frequency portion of said inverse Hilbert transform response, and said combiner combines said low-frequency portion of said inverse Hilbert transform response with said in-phase synchronous detection response, and suppresses demodulation artifacts of said co-channel analog television signal that otherwise accompany said in-phase synchronous detection response in a combiner output signal.

24. The radio receiver of claim 23, wherein said filter circuitry also separates said high-frequency portion of said inverse Hilbert transform response, and wherein said combiner also combines said high-frequency portion of said inverse Hilbert transform response with said in-phase synchronous detection response to increase the high frequency content of said combiner output signal.

25. The radio receiver of claim 24, further comprising:

channel equalization filtering for supplying an equalized channel response to said combiner output signal.

* * * * *